(12) United States Patent
Berg et al.

(10) Patent No.: US 8,190,099 B2
(45) Date of Patent: May 29, 2012

(54) SWITCH-LESS BIDIRECTIONAL AMPLIFIER

(75) Inventors: Håkan Berg, Harestad (SE); Heiko Thiesies, Torslanda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 377 days.

(21) Appl. No.: 12/438,844

(22) PCT Filed: Aug. 28, 2006

(86) PCT No.: PCT/SE2006/000990
§ 371 (c)(1), (2), (4) Date: Nov. 11, 2009

(87) PCT Pub. No.: WO2008/026972
PCT Pub. Date: Mar. 6, 2008

(65) Prior Publication Data
US 2010/0060360 A1    Mar. 11, 2010

(51) Int. Cl.
*H04B 1/38* (2006.01)
(52) U.S. Cl. ........ 455/73; 455/114.3; 330/277; 330/286
(58) Field of Classification Search .................... 455/73, 455/78, 114.3, 127.1, 127.2, 194.2, 341; 330/54, 277, 286, 296
See application file for complete search history.

(56) References Cited

U.S. PATENT DOCUMENTS 5,669,068 A * 9/1997 Kielmeyer et al. ............. 455/83
7,239,852 B2 * 7/2007 Yang et al. ..................... 455/78

FOREIGN PATENT DOCUMENTS

EP    1505726 A1    2/2005

* cited by examiner

Primary Examiner — Tuan H Nguyen

(57) ABSTRACT

A bi-directional amplifier, transceiver, integrated circuit, mobile unit, telecommunication infrastructure for amplification of signals received or signals to be transmitted in a communication circuit and a method for bi-directional amplification comprising amplifying signals in a bi-directional amplifier and directing a signal between two or more different paths comprising at least one first biased semiconductor amplification element coupled to a at least one first impedance matching network, at least one second biased semiconductor amplification element coupled to a second impedance matching network, a first device for biasing the at least one first biased semiconductor amplification element and a second device for biasing the at least one second biased semiconductor amplification element where the direction of signal amplification in said bi-directional amplifier is controlled by the first or second device for biasing the at least one first or second biased semiconductor amplification element.

23 Claims, 5 Drawing Sheets

SWITCH-LESS BIDIRECTIONAL AMPLIFIER

TECHNICAL FIELD

The present invention relates to bidirectional amplifiers as they are for example used in microwave transceivers.

BACKGROUND OF THE INVENTION

At present in the field of microwave systems equipped with a common receive and transmit antenna it is desired to use a common leg for both transmit and receive signal paths. This is not a problem when using passive reciprocal components. However, when using active components one encounters a problem, since amplifiers by definition are non-reciprocal. Normally, one uses external switches and one or two amplifiers to switch between signal paths and amplification in one or the other direction.

An illustration of this principle is given in the form of two examples in FIG. 1.

The problem with such a configuration is that the switches occupy valuable area on the circuit chip and introduce signal losses. These signal losses have a negative impact on the linearity and the noise figure of the transceiver circuit. Moreover, the switches exhibit a more or less unpredictable current leakage which degrades the performance of such a transceiver circuit.

One solution that is based on the principle of example (a) in FIG. 1 is described in the Japanese patent application JP632663808. This document uses switching of two groups of two transistors by applying suitable bias voltage to the respective transistor group, where the first group of transistors amplifies a signal incident on a first terminal and the second group a signal incident on a second terminal of the circuit. This solution however, is not a true bidirectional solution, since the amplifiers in both groups always amplify a signal in one direction only. Also, the amount of amplifiers takes up valuable space on the circuit board.

One other solution based on the principle of example (b) in FIG. 1 is shown in "Wideband bidirectional MMIC amplifiers for new generation T/R module". However, this solution also is not really a bidirectional solution either, since the amplifiers only amplify the signal in one direction. The four-port and above all the cross-coupled structure described also introduce undesired signal losses.

In addition to the more or less standard solutions, U.S. Pat. No. 5,821,813 describes a structure in which a transistor amplifier is biased in such a way that it can amplify a signal in both directions. However, since the transistor is connected in "common-gate" mode to the rest of the circuit, additional output impedance compensation circuitry is needed to keep the output of the transistor amplifier stable, thus taking up additional valuable space on the circuit board or chip. Separate regulation of the drain-, gate- and source-voltages is also necessary.

Finally, U.S. Pat. No. 5,821,813 describes a solution in which two transistor amplifiers are used as a bidirectional amplifier. Apart from adding one more transistor to the circuit board which occupies additional space and adds to the noise figure of the amplified signal, an additional variable impedance matching network is needed in order to match the output impedance of the one of the transistors to the input impedance of one other transistor adding to the complexity of the circuit.

The object of the present invention is therefore to rectify some or all of the disadvantages with prior art.

SUMMARY OF THE INVENTION

According to a first aspect of the invention the above object is achieved by a bi-directional amplifier for amplification of signals received or signals to be transmitted in a communication circuit, where the bi-directional amplifier comprises at least one first biased semiconductor amplification element connected to a first impedance matching network, at least one second biased semiconductor amplification element connected to a second impedance matching network, a first device for biasing the at least one first biased semiconductor amplification element and a second device for biasing the at least one second biased semiconductor amplification element where the direction of signal amplification in said bi-directional amplifier is controlled by the first or second device for biasing the at least one first or second biased semiconductor amplification element.

In this fashion use of switches which normally entails signal losses in an amplification circuit and leakage currents is avoided.

Also, by using biased semiconductor amplification elements the valuable area occupied by the bi-directional amplifier according to the invention is drastically minimized. At the same time signals entering the circuit, be it received signals or signals to be transmitted, may be amplified on the same transmission line without switching.

One possible configuration in which the at least one first and at least one second biased semiconductor amplification elements may be connected is an anti-parallel configuration. The advantage of this configuration is a symmetrical amplification circuit which can amplify in the direction desired only by choosing which biased semiconductor amplification element is to be biased for no current (under the threshold) and which one is to be biased for amplification, i.e. above the threshold.

Apart from that, these at least two biased semiconductor amplification elements may be connected so as to provide parallel feedback. Parallel feedback is a simple way of achieving equal input and output impedance in the circuit in order to avoid signal reflections due to impedance mismatch. Impedance matching is important when the bi-direction amplifier is to be used in a microwave-based communication circuit.

In this context, the at least at least one first and at least one second semiconductor amplification elements may comprise discrete semiconductor components operable in the microwave frequency range even though the bi-directional amplifier according to the present invention may be used in other frequency ranges.

However, these biased semiconductor amplification elements may equally be integrated into an integrated circuit device. Especially in integrated circuits common in microwave applications, so called MMICs (Monolithic Microwave Integrated Circuits), the use of the bi-directional amplifier according to the present invention is advantageous, since MMIC switches which are normally necessary for switching the direction of signal amplification are thereby made obsolete. Also, the integrated solution for the bi-directional amplifier according to the invention would further reduce the area occupied on the chip by the bi-directional amplifier.

The at least one first and second biased semiconductor amplification elements may comprise elements from the group of bi-polar transistors, HBTs (Heterojunction Bi-polar Transistors), MOSFETs (Metal Oxide Semiconductor Field Effect Transistors), HEMTs (High Electron Mobility Transistors) and other types of biased semiconductor amplification elements suitable for use as amplification elements.

In one embodiment of the present invention, the at least one first and at least one second biased semiconductor amplification elements are connected to a first impedance matching network which is an input impedance matching network for the at least one first biased semiconductor amplification element and an output impedance matching network for the at least one second biased semiconductor amplification element and where the at least one second impedance matching network is an output impedance matching network for the at least one first biased semiconductor amplification element and an input impedance matching network for the at least one second biased semiconductor amplification element.

According to another embodiment of the present invention a third impedance matching network is connected between the at least one first and at least one second biased semiconductor amplification elements, respectively.

The advantage of this configuration is the possibility to use the bi-directional amplifier to direct and amplify a signal in a desired direction without the disadvantages introduced when using a switch.

According to yet another embodiment of the present invention the at least one first biased semiconductor amplification element is further connected in parallel with N−1 biased semiconductor amplification elements, each connected to their individual impedance matching networks, wherein the N−1 biased semiconductor amplification elements are connected in parallel to the at least one second biased semiconductor amplification element, where the at least one first biased semiconductor amplification element and the at least one second biased semiconductor amplification elements are adapted to act as an N-to-1 or 1-to-N switch, since the circuit in this case is bi-directional.

Also, one may equally provide for a configuration where at least one second biased semiconductor amplification element is further connected in parallel with N−1 other biased semiconductor amplification elements, each connected to their individual impedance matching networks, where the at least one first and the at least one second biased semiconductor amplification element and the N−1 other biased semiconductor amplification elements connected in parallel with the at least one second transistor are adapted to act as a 1-to-N or N-to-1 switch.

In an even more general configuration one may provide for a first biased semiconductor amplification element connected in parallel with N−1 other biased semiconductor amplification elements each connected to their individual impedance matching networks, where the second biased semiconductor amplification element is connected in parallel with N−1 other biased semiconductor amplification elements each connected to their individual impedance matching networks, and where N−1 biased semiconductor amplification elements are connected in parallel with the first biased semiconductor amplification element, where the first biased semiconductor amplification element, the second biased semiconductor amplification element and the N−1 biased semiconductor amplification elements are connected in parallel with the second biased semiconductor amplification element and adapted to act as a bi-directional N-to-N switch.

The main advantage of the three configurations mentioned above is the avoidance of the use of switches taking up valuable space on the chip while at the same time being able to both direct and amplify a signal in the desired direction irrespective whether it is a received signal or a signal to be transmitted by the circuit. The last configuration mentioned above would make it possible to direct and amplify signal form any direction into any other direction without using switches.

According to yet another embodiment of the present invention, at least one first biased semiconductor amplification element is connected into a parallel feedback configuration with at least one impedance element, where the at least one first biased semiconductor amplification element is connected to at least one first impedance matching network, a common impedance matching network and where at least one second biased semiconductor amplification element is connected in a parallel feedback configuration with an impedance element, the second biased semiconductor amplification element being further connected to the common impedance matching network and where the at least one second biased semiconductor amplification element being further connected to a second impedance matching network.

By using this configuration, the bi-directional amplifier according to the invention may be used to combine two uni-directional input channels into one output channel.

According to yet another embodiment of the present invention, at least one first pair of biased semiconductor amplification elements comprising at least one first biased semiconductor amplification element and at least one second biased semiconductor amplification element are connected in an anti-parallel configuration to each other, where the at least one pair of biased semiconductor amplification elements is further connected to at least one first impedance matching network and one common impedance matching network, where the bi-directional amplifier further comprises at least one second pair of biased semiconductor amplification elements which in turn comprises at least one third biased semiconductor amplification element and at least one fourth biased semiconductor amplification element connected in an anti-parallel configuration to each other, where said at least one second pair of biased semiconductor amplification elements is connected to the common impedance matching network and at least one second impedance matching network.

In this fashion two bi-direction channels may be combined into one output channel.

According to another aspect of the present invention the object of the invention is achieved by a method for bi-directional amplification of signals received or signals to be transmitted in a communication network where the method comprises the steps of:

a) obtaining a bi-directional amplifier comprising at least one first biased semiconductor amplification element connected to a first impedance matching network, at least one second biased semiconductor amplification element connected to a second impedance matching network which further comprises a first device for biasing the first biased semiconductor amplification element and a second device for biasing the second biased semiconductor amplification element b) amplifying a signal received at the first or the second biased semiconductor amplification element or a signal to be transmitted from the first or the second biased semiconductor amplification element by biasing the second biased semiconductor amplification element for zero current, while biasing the first biased semiconductor amplification element for non-zero current or by biasing the first biased semiconductor amplification element for zero current, while biasing the second based semiconductor for non-zero current.

The method is especially suited to be used with the embodiment of the bi-directional amplifier described above.

According to another aspect of the present invention the object of the invention is achieved by a method for amplifying signals in a bi-directional amplifier comprising the steps of:

a) connecting at least one first biased semiconductor amplification element to at least one first impedance matching network and at least one first biasing network;

b) connecting at least one second biased semiconductor amplification element to at least one second impedance matching network and at least one second biasing network;

c) connecting the at least one first and second biased amplification elements in series or in parallel to each other;
d) using the at least one first and second biasing network to bias the at least one first biased semiconductor amplification element below threshold and the at least one second biased semiconductor amplification element above threshold or vice-versa in order to amplify a signal received or to be transmitted through the bi-directional amplifier.

According to yet another aspect of the present invention the object of the invention is achieved by a method for directing a signal between two or more different paths which comprises the steps of:
a) connecting at least one first biased semiconductor amplification element to at least one first impedance matching network and at least one first biasing network;
b) connecting one or more additional first biased semiconductor amplification elements in parallel to the at least one first biased semiconductor amplification element;
c) connecting one or more additional first impedance matching networks to each of the one or more first biased semiconductor amplification elements;
d) connecting at least one second biased semiconductor amplification element to the at least one first biased semiconductor amplification element, at least one first impedance matching network and at least one first biasing network
e) connecting one or more additional second biased semiconductor amplification elements in parallel to the at least one second biased semiconductor amplification element;
f) connecting one or more additional second impedance matching networks to each of the one or more second biased semiconductor amplification elements;
g) connecting at least one additional first biasing network to each of the one or more additional first biased semiconductor amplification elements and at least one additional second biasing network to each of the one or more additional second biased semiconductor amplification elements; and
h) biasing at least one of the first biased semiconductor amplification elements above threshold and at least one of said second biased amplification elements below threshold or vice versa in order to direct and amplify a received signal or a signal to be transmitted through the bi-directional amplifier.

In this fashion signals may be both directed in the desired direction and amplified, but also multiplexed or demultiplexed in case more than one first and second semiconductor amplification element is biased above and below threshold, while avoiding the disadvantages when using a switch to switch signals.

According to yet another aspect of the present invention the object of the same is achieved by a bi-directional transceiver for signals in a communication circuit comprising at least one first biased semiconductor amplification element with a corresponding first impedance matching network and at least one second biased semiconductor amplification element with a corresponding second impedance matching network, a first device for biasing the first biased semiconductor amplification element and a second device for biasing the second biased semiconductor amplification element, where the first and the second biased semiconductor amplification elements are connected in an anti-parallel configuration in relation to each other and that the first and the second devices for biasing are adapted to alternatively bias the first and the second biased semiconductor amplification elements.

This aspect of the present invention may be applied in microwave transceiver circuits using one antenna for both transmission and reception of communication signals.

According to yet another aspect of the present invention the object of the same is achieved by an integrated circuit comprising a bi-directional amplifier for amplification of signals received or signals to be transmitted in a communication circuit, comprising at least one first biased semiconductor amplification element connected to a first impedance matching network, at least one second biased semiconductor amplification element connected to a second impedance matching network, a first device for biasing the first biased semiconductor amplification element and a second device for biasing the second biased semiconductor amplification element characterized in that the direction of signal amplification is controlled by the first or the second device for biasing the first or second biased semiconductor amplification element and where the first and the second biased semiconductor amplification elements are connected in an anti-parallel configuration.

This integrated circuit may find application in MMIC circuits, but could easily be adapted to perform its function in other types of integrated circuits.

According to yet another aspect of the present invention the object of the same is achieved by a mobile unit comprising a bi-directional amplifier for amplification of signals received or signals to be transmitted in a communication circuit, comprising at least one first biased semiconductor amplification element connected to a first impedance matching network, at least one second biased semiconductor amplification element connected to a second impedance matching network, a first device for biasing the first biased semiconductor amplification element and a second device for biasing the second biased semiconductor amplification element characterized in that the direction of signal amplification is controlled by the first or the second device for biasing the first or second biased semiconductor amplification element and where the first and second biased semiconductor amplification elements are connected in an anti-parallel configuration.

Finally, according to yet another aspect of the present invention the object of the same is achieved by a telecommunications infrastructure component comprising a bi-directional amplifier for amplification of signals received or signals to be transmitted in a communication circuit, comprising at least one first biased semiconductor amplification element connected to a first impedance matching network, at least one second biased semiconductor amplification element connected to a second impedance matching network a first device for biasing the first biased semiconductor amplification element and a second device for biasing the second biased semiconductor amplification element characterized in that the direction of signal amplification is controlled by the first or the second device for biasing the first or second biased semiconductor amplification elements and where the first and said second biased semiconductor amplification elements are connected in an anti-parallel configuration.

These and other advantages of the present invention will become clearer with the following detailed description of some of the embodiments of the present invention with reference to the accompanying drawings.

SHORT DESCRIPTION OF THE DRAWINGS

Figure 6:
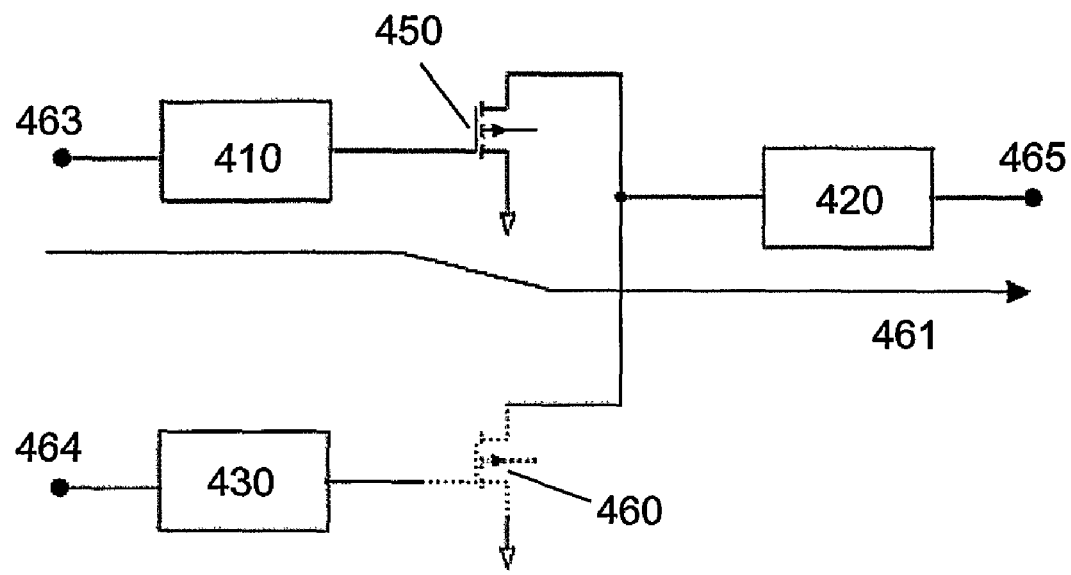
Figure 7:
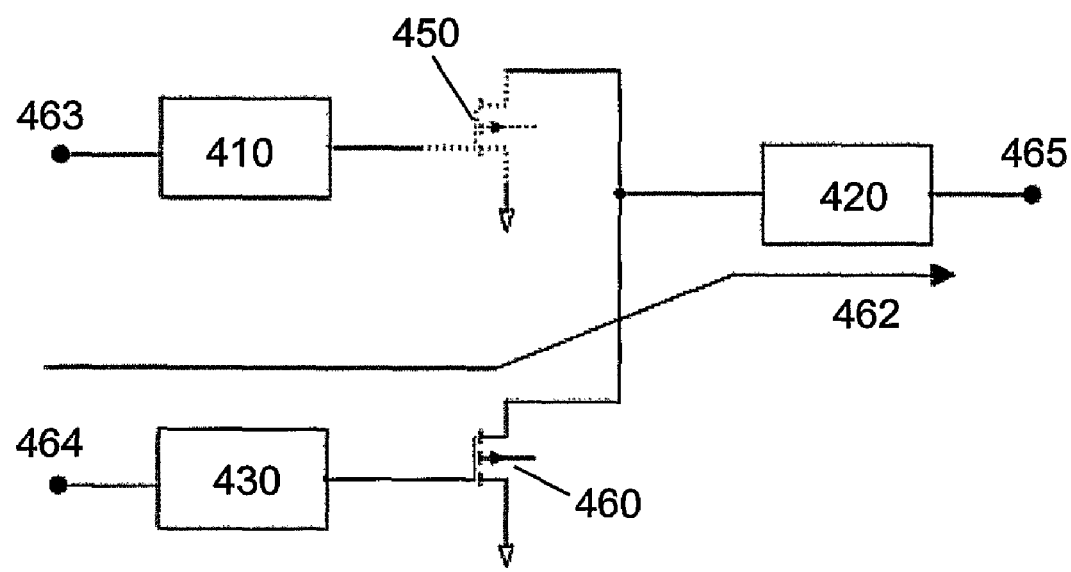
Figure 8:
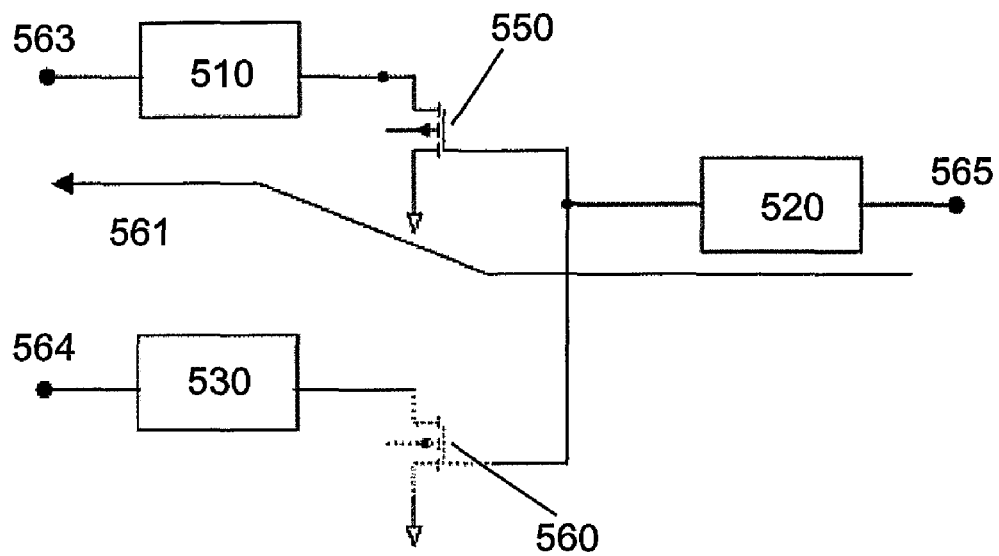
Figure 9:
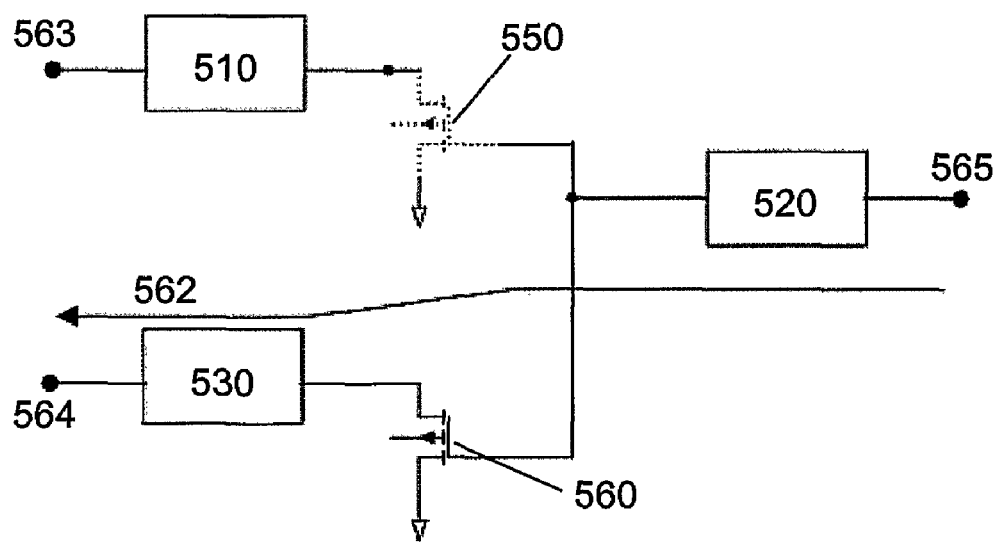
Figure 10:
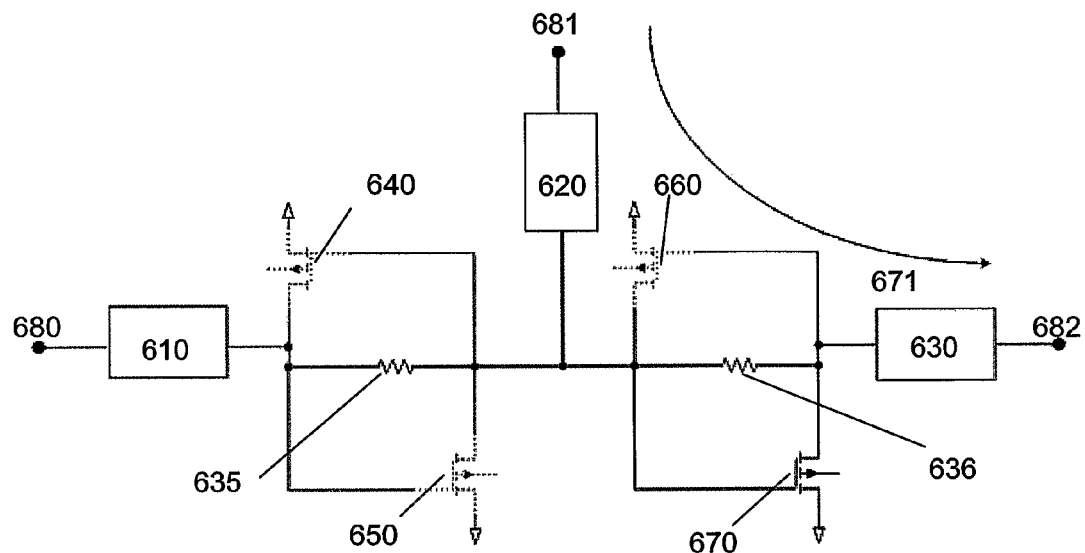

FIG. 6 shows yet another embodiment of the present invention with selection of one of two unidirectional channels FIG. 7 shows the embodiment of FIG. 6 with the selection of the other unidirectional channel FIG. 8 shows another embodiment of the present invention with forwarding of one channel among one other unidirectional channel FIG. 9 shows the embodiment of FIG. 8 with forwarding of one channel among one other unidirectional channel FIG. 10 shows yet another embodiment of the present invention where two bi-directional channels are combined into one channel.

Figure 11:
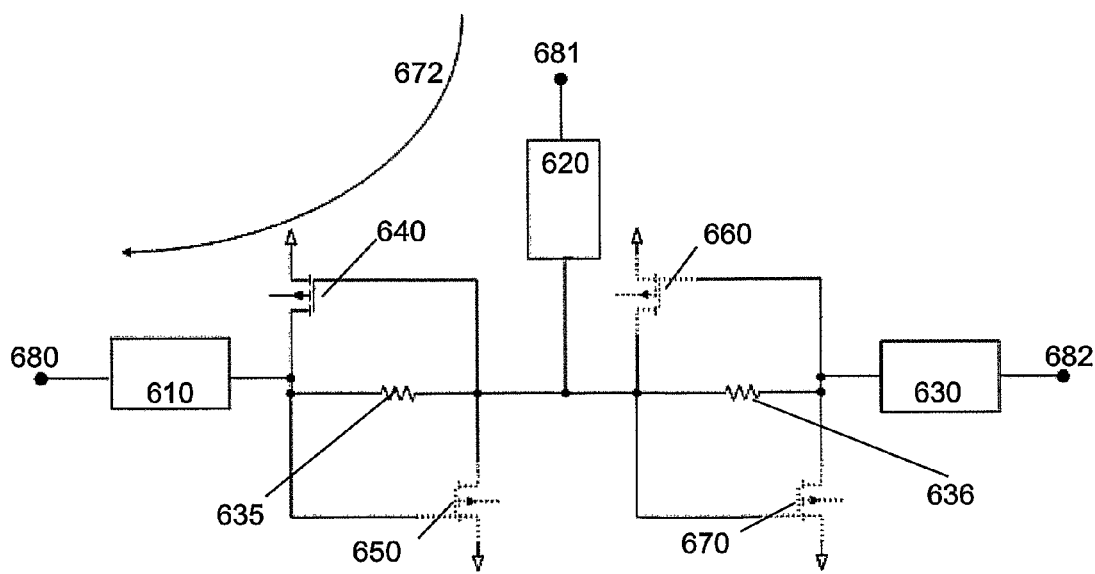

FIG. 11 shows the embodiment of FIG. 10 where two bi-directional channels are combined into one channel along a different route

DETAILED DESCRIPTION OF THE PREFERRED EMBODIMENTS

Figure 1:
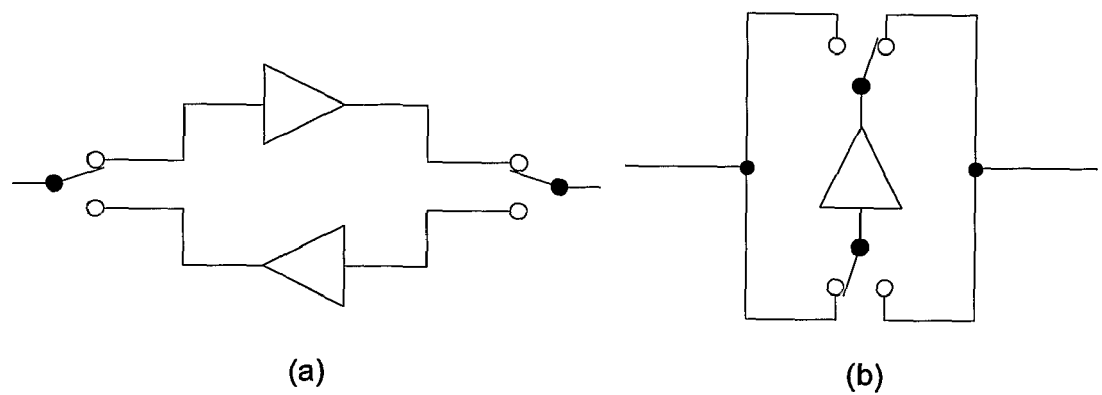
FIG. 1 illustrates two examples of prior art bi-directional amplifiers
Figure 2:
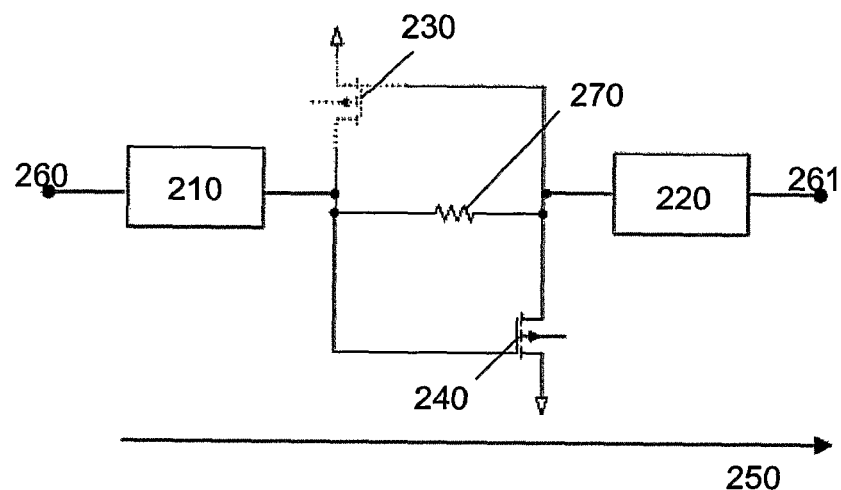
FIG. 2 shows a first embodiment of the present invention with amplification in one direction FIG. 3 show the embodiment of FIG. 2 with amplification in the opposite direction

Turning now to FIG. 2, a first embodiment of the present invention is shown. Here, an example of the inventive bi-directional amplifier is shown, where reference numbers 230 and 240 depict a first and a second transistor connected in an anti-parallel configuration in relation to each other using parallel feedback.

Anti-parallel in this case means the gate terminal of the first transistor 230 is connected to the drain terminal of the second transistor and the gate terminal of the second transistor 240 is connected to the drain terminal of the first transistor 230. The resistor 270 between the first and second transistors (230, 240) is one way of achieving equal impedance for the two transistors. Of course any other means, such as an impedance matching network may be used to achieve the equal input impedance for the two transistors.

Even though the embodiments of the present invention described in the accompanying drawings use FETs (Field Effect Transistors) as amplification devices, it is equally possible to use other types of amplification devices, such as, for example, elements from the group of bi-polar transistors, HBTs (Heterojunction Bi-polar Transistors, HEMTs (High Electron Mobility Transistors) and other types of biased semiconductor amplification elements suitable for use as amplification elements. The terms gate, drain and source terminals used for FETs should then be replaced by corresponding terms commonly used for the terminals of the respective amplification device.

A first input impedance matching network 210 is connected to the gate terminal of the first transistor 230 and the resistor 270 common to the two transistors (230, 240) and a second impedance matching network 220 is connected to the gate terminal of the second transistor and the resistor 270 common to the two transistors (230, 240). The second impedance matching network 220 acts as an output impedance matching network for the second transistor 240 as well as input impedance matching network for first transistor 230 and the first input impedance matching network 210 acts as an output impedance matching network for the first transistor 230 and as input impedance matching network for second transistor 240. Although many types of transistors serving the role of amplifiers may be used in the arrangement of the present invention, this example illustrates the use of two MOSFET (Metal Oxide Semiconductor Field Effect Transistor).

In a microwave communication circuit, it is of utmost importance to keep input and output impedances of each transistor matched to the line impedance, since unmatched input and output impedances lead to signal losses, stability problems, frequency ripple and other undesired problems due to signal reflection.

According to the present invention, a signal which is to be amplified may, for example, enter the electric circuit in FIG. 2 at the point 260. This signal passes the first impedance matching network 210 and arrives at the gate of the second transistor 240. Now, in order to amplify the signal propagating from left to right, the first amplifier 230 is biased in pinch-off mode (illustrated with the dotted symbol in FIG. 2) and thus the first transistor 230 is effectively turned off. At the same time, the second amplifier is biased above threshold and therefore turned on. Hence the signal entering the circuit at the point 260 and propagating to the right, passing the first impedance matching network 210 and the second transistor 240 will be amplified by the second transistor 240 and pass through the second impedance matching network 220 and out of the circuit at point 261.

The direction of amplification 250 is indicated by the arrow pointing to the right.

Since the circuit in FIG. 2 is a bi-directional circuit, the points 260 and 261 may be either input and output terminals or vice versa.

Figure 3:
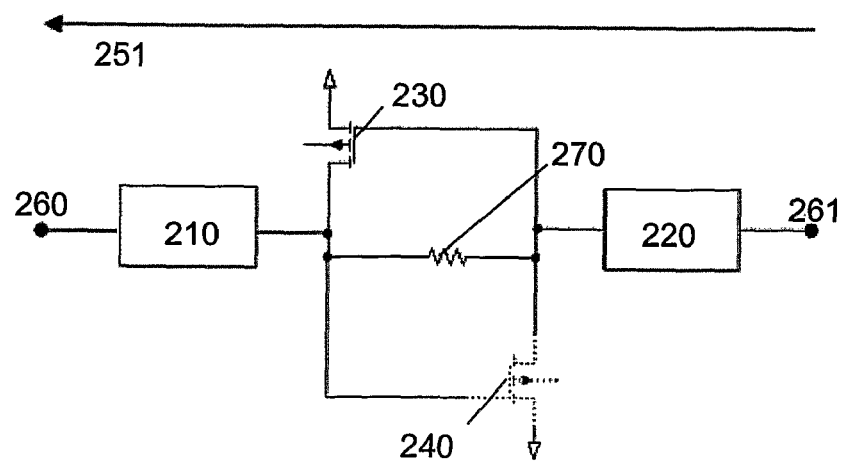

The circuit if FIG. 3 is identical to the bi-directional amplifier circuit of FIG. 2, and therefore the reference numbers from FIG. 2 have been retained.

Turning now to FIG. 3, if a signal passing from the point 261 to the left, thus passing the second impedance matching network 220 and arriving at the gate terminal of the first transistor 230, is to be amplified, the second transistor 240 is biased in pinch-off mode, thus effectively being turned-off, while the first transistor 230 is biased above threshold, thus amplifying the signal traveling from right to left. The direction of amplification is also illustrated by the arrow 251 pointing to the left. Similarly to the case in FIG. 2, and due to the bi-directional nature of the circuit in FIG. 3, the incoming signal traveling through the circuit in FIG. 3 from the point 261 to the left may either be a signal received from an antenna or a signal which is to be transmitted to an antenna.

Figure 4:
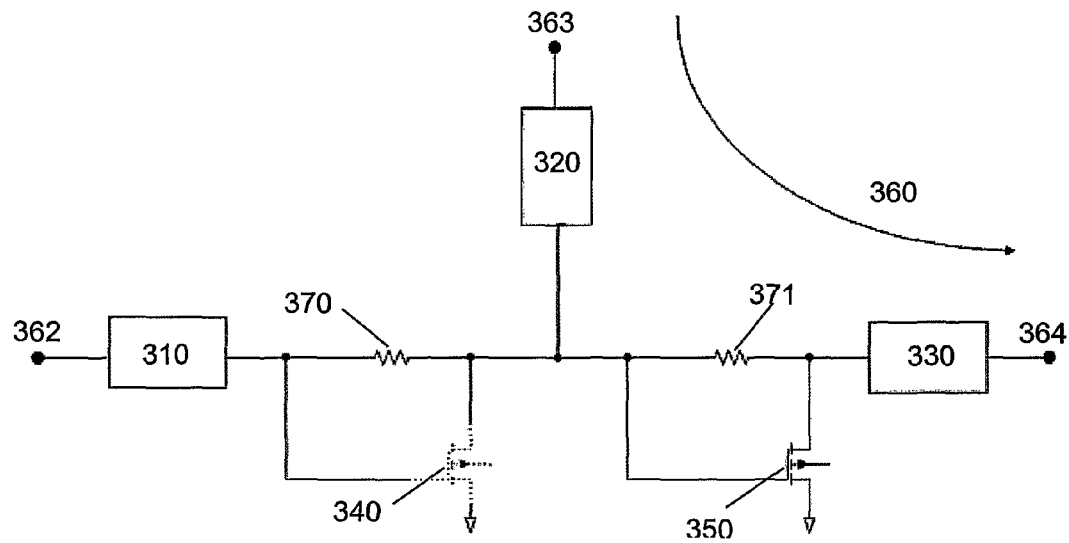
FIG. 4 shows a second embodiment of the present invention where two unidirectional channels are combined into one channel.

FIG. 4 illustrates another exemplary embodiment of the present invention, where two unidirectional channels are combined into one channel. In this case, the first transistor 340 and the second transistor 350 are again connected in a "transmit/receive" configuration, but no feed-back mechanism between the two transistors is used, since the transistor configuration is used to direct a signal in two different directions.

For this purpose, the first transistor 340 is connected to a first impedance matching network 310 and to a common impedance matching network 320 for both the first transistor 340 and the second transistor 350. The second transistor 350 in turn, is connected to a second impedance matching network 330 and also to the common impedance matching network 320 for both transistors. Both transistors are connected in a so called "common source" configuration, i.e. their source terminals are grounded. The transistors are connected to each other in such a way that the gate terminal of the second transistor 350 is connected to the drain terminal of the first transistor 340. Furthermore, the first impedance matching network 310 is connected to the gate terminal of the first transistor 340, whereas the common impedance matching network 320 is connected to the drain terminal of the first transistor 340 and the gate terminal of the second transistor 350. Finally, the second impedance matching network 330 is connected to the drain terminal of the second transistor 350.

In this embodiment, the first impedance matching network 310 is acting as the input impedance matching network for the first transistor 340, while the common impedance matching network 320 is used as the output impedance matching network for the first transistor 340. On the other hand, the second impedance matching network 330 takes on the role of the output impedance matching network for the second transistor 350, while the common impedance matching network 320 acts as an input impedance matching network for the second transistor 350.

The two resistors 370 and 371 are connected between the drain and gate terminals for the first and second transistors 340 and 350.

Switching (and amplification) of a signal traveling through the circuit of FIG. 4 from the ingress/egress point 363 to the right, where the switching direction is indicated by the curved arrow 360, is performed by biasing the first transistor 340 in pinch-off mode, thus effectively turning off the first transistor and biasing the second transistor 350 above threshold thus allowing the signal to pass through the ingress/egress point 363, the common impedance matching network 320, the second transistor 350 and the second impedance matching network 330.

Figure 5:
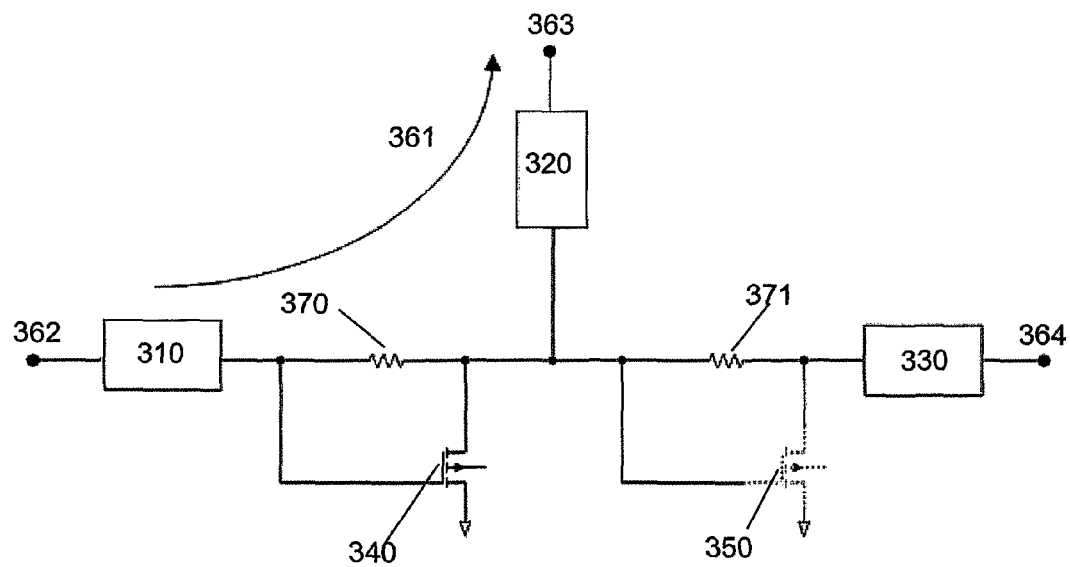
FIG. 5 shows the embodiment of FIG. 4 where two unidirectional channels are combined into one channel along a different route.

In FIG. 5, an identical circuit as in FIG. 4 is shown, where the switching (and amplification direction is indicated by the curved arrow 361. In order to perform switching (and amplification) of a signal in this direction, the second transistor 350 is biased in pinch-off mode, hence being turned off, while the first transistor 340 is biased above threshold, thus opening the path for a signal traveling from the ingress point 362 to the right and passing through the first impedance matching network 310, the first transistor 340 and common impedance matching network 320 for the two transistors.

Of course, the invention is not limited to the embodiment shown in FIGS. 4 and 5. One could connect N transistors in parallel in the configuration depicted in these figures where each transistor to the left of the common impedance matching network 320 would have its own first impedance matching network and where each transistor to the right of the second impedance matching network would have its own third impedance matching network. In this fashion N/2 unidirectional channels may be combined into one channel.

FIG. 6 illustrates yet another embodiment of the present invention where a first transistor 450 and a second transistor 460 are connected in parallel, where the drain terminal of the first transistor 450 is connected to the drain terminal of the second transistor 460. The gate terminals of each transistor are connected to respective input impedance matching networks 430 and 410, while the first transistor 450 and the second transistor 460 share a common output impedance matching network 420. It should be mentioned that the two input impedance matching networks 410 and 430 need not be and usually are not identical. In the situation depicted in FIG. 6 the second transistor 460 is biased by a first biasing network (not shown) into pinch-off mode and thus turned off, while the first transistor 450 is biased above threshold by a second biasing network (not shown) and therefore turned on. The communication channel is then defined by a signal passing through the first ingress node 463, the first impedance matching network 410, the first transistor 450, the common output impedance matching network 420 and leaving the circuit through the egress node 465, the direction of signal flow (and amplification) shown by the arrow 461.

In FIG. 7, the same embodiment as in FIG. 6 is illustrated but with the first transistor 450 biased in pinch-off mode and therefore turned off, while the second transistor 460 is biased above threshold, thus being turned on. In this situation, the communication channel is defined by the signal entering the circuit at the second ingress node 464, the second input impedance matching network 430, the second transistor 460, the common output impedance matching network 420 and leaving the circuit through the egress node 465 with the direction of signal flow indicated by the arrow 462.

The advantage of this embodiment is the possibility of combining two or more channels into one channel without using a switch and thus introducing signal leakage and losses in the electric circuit.

Of course, in the embodiment illustrated in FIGS. 6 and 7 the number of transistors connected in parallel is not limited to only two transistors. Basically, N transistors may be connected in series thus being able to combine N channels into one channel by using one or several biasing networks to turn the appropriate transistors on or off.

FIG. 8 illustrates yet another embodiment of the present invention where a signal may be directed towards different paths. A first transistor 550 and a second transistor 560 are connected in parallel, whereby the first transistor 550 is further connected to a first output impedance matching network 510 and the second transistor 560 is connected to second output impedance matching network 530. Additionally, the first and second transistors 550 and 560 are connected to a common input impedance matching network 520. Using a first and a second biasing network (not shown) the second transistor 560 is biased in pinch-off mode (thus switched off) and the first transistor 550 is biased above threshold and thus turned on.

In the situation illustrated in the figure, the channel along which the signal is then flowing is defined by the ingress node 565 where the signal is entering the circuit, the common input impedance matching network 520, the first transistor 550, the second output impedance matching network 510 and the first egress node 563 through which the signal is leaving the circuit. The direction of signal flow and amplification is then indicated by the arrow 561.

The same embodiment is illustrated in FIG. 9, where however the first transistor 550 is switched off (indicated by a dotted symbol) and the second transistor 560 is switched on, directing the signal entering the circuit through the ingress node 565 through the common input impedance matching network 520, the second transistor 560, the second output impedance matching network 530 and leaving the circuit through the second egress node 564.

FIG. 10 illustrates an embodiment of the present invention where two bi-directional communication channels are combined into one channel.

The first channel is defined by the signal entering the circuit at the second ingress/egress node 681, the second impedance matching network 620, the transistor 670, the third impedance matching network 630, and the third egress/ingress node 682 through which the signal is leaving the circuit. The direction of signal amplification is indicated by the arrow 671. In order for the received or transmitted signal to flow in this direction, transistors 640, 650 and 660 are biased in pinch-off mode (which is illustrated by dotted symbols) and thus are turned off, while transistor 670 is biased above threshold and therefore turned on. Impedance matching between the first group of transistors (first and second transistors 640 and 650) is in this example embodiment achieved by a resistor 635, while matching between the second group of transistors (third and fourth transistors 660 and 670) by a resistor 636. It should be noted however, that this impedance matching may equally be achieved by another impedance element or a matching network.

FIG. 11 illustrates with the arrow 672 the direction of amplification for the second channel which is defined by the second ingress/egress node 681, the second impedance matching network 620, the transistor 640, the first impedance matching network 610, and the first egress/ingress node 680 through which the signal is leaving the circuit. In order for the received signal or the signal to be transmitted to be amplified in this direction, transistors 650, 660 and 670 are biased in pinch-off mode and therefore turned off (which is indicated by dotted symbols), whereas the transistor 640 is biased above threshold and therefore turned on.

The first, second and third nodes 680, 681, 682 are both ingress and egress nodes, since the amplification circuit in FIGS. 10 and 11 are bi-directional.

It is worth mentioning that the embodiments in FIGS. 10 and 11 may include up to N transistor pairs connected into the anti-parallel configuration shown in these figures. In this way N bi-directional channels may be combined into one channel.

In the embodiments of the invention described above, although not illustrated, biasing networks, such as networks comprising voltage sources are used to bias the transistors into pinch-off mode and above threshold in order to turn them off and on respectively.

What is claimed is:

1. A bi-directional amplifier for amplification of signals received or signals to be transmitted in a communication circuit, comprising:
   at least one first biased semiconductor amplification element coupled to a first impedance matching network;
   at least one second biased semiconductor amplification element coupled to a second impedance matching network;
   a first device for biasing said at least one first biased semiconductor amplification element and a second device for biasing said at least one second biased semiconductor amplification element wherein the direction of signal amplification in said bi-directional amplifier is controlled by said first or said second device for biasing said at least one first or second biased semiconductor amplification element;
   said first impedance matching network is a first common impedance matching network for said at least one first biased semiconductor amplification element and for said at least one second biased semiconductor amplification element;
   said second impedance matching network is a second common impedance matching network for said at least one first biased semiconductor element, wherein
      the first common impedance network is an output impedance matching network for said at least one first biased semiconductor element and an input impedance matching network for said at least one second biased semiconductor element, and
      the second common impedance matching network is an output impedance matching network for said at least one second biased semiconductor element and an input impedance matching network for said at least one first biased semiconductor element,
      the bi-directional amplifier further comprises means for achieving equal impedances for said at least one first and said at least one second biased semiconductor elements, wherein said means is connected between said at least one first and said at least one second biased semiconductor elements.

2. The bi-directional amplifier according to claim 1, where said at least one first and said second biased semiconductor amplification elements are connected in an anti-parallel configuration.

3. The bi-directional amplifier according to claim 1, wherein said anti-parallel configuration further comprises parallel feedback.

4. The bi-directional amplifier according to claim 1, wherein said first or second biased semiconductor amplification element is adapted to amplify a received signal in one direction and a transmitted signal in the opposite direction.

5. The bi-directional amplifier according to claim 1, wherein a third impedance matching network is coupled between said at least one first and said at least one second biased semiconductor amplification elements, respectively.

6. The bi-directional amplifier according to claim 5, wherein said amplifier is adapted to direct said signal to one of a plurality of available signal paths.

7. The bi-directional amplifier according to claim 5, wherein said at least one first biased semiconductor amplification element is further coupled in parallel with N−1 biased semiconductor amplification elements, each coupled to their individual impedance matching networks, wherein said N−1 biased semiconductor amplification elements are coupled in parallel to said at least one second biased semiconductor amplification element, said at least one first biased semiconductor amplification element and said at least one second biased semiconductor amplification elements adapted to act as a N-to-1 or 1-to-N switch.

8. The bi-directional amplifier according to claim 5, wherein said at least one second biased semiconductor amplification element is further coupled in parallel with N−1 other biased semiconductor amplification elements, each coupled to their individual impedance matching networks, where said at least one first and said at least one second biased semiconductor amplification element and said N−1 other biased semiconductor amplification elements coupled in parallel with said at least one second semiconductor amplification element are adapted to act as a 1-to-N or N-to-1 switch.

9. The bi-directional amplifier according to claim 5, wherein said first biased semiconductor amplification element is coupled in parallel with N−1 other first biased semiconductor amplification elements each coupled to their individual impedance matching networks, said second biased semiconductor amplification element coupled in parallel with N−1 other second biased semiconductor amplification elements each coupled to their individual impedance matching networks, said N−1 biased semiconductor amplification elements coupled in parallel with said first biased semiconductor amplification element, said first biased semiconductor amplification element, said second biased semiconductor amplification element, said N−1 coupled in parallel with said second biased semiconductor amplification element are adapted to act as a bi-directional N-to-N switch.

10. The bi-directional amplifier according to claim 5, wherein said at least one first biased semiconductor amplification element is coupled into a parallel feedback configuration with at least one impedance element, said at least one first biased semiconductor amplification element being coupled to at least one first impedance matching network, a common impedance matching network and at least one second biased semiconductor amplification element coupled in a parallel feedback configuration with another impedance element, said at least one second biased semiconductor amplification element being further coupled to a second impedance matching network.

11. The bi-directional amplifier according to claim 1, wherein at least one first pair of biased semiconductor amplification elements comprising at least one first biased semiconductor amplification element and at least one second biased semiconductor amplification element are coupled in an anti-parallel configuration to each other, said at least one pair of biased semiconductor amplification elements being further coupled to at least one first impedance matching network and one common impedance matching network, said bi-directional amplifier further comprising at least one second pair of biased semiconductor amplification elements comprising at least one third biased semiconductor amplification element and at least one fourth biased semiconductor amplification element coupled in an anti-parallel configuration to each other, where said at least one second pair of biased semiconductor amplification elements is coupled to said common impedance matching network and at least one second impedance matching network.

12. The bi-directional amplifier according claim 1, wherein said communication circuit comprises a microwave-based communication circuit.

13. The bi-directional amplifier according to claim 1, wherein said at least one first and said at least one second semiconductor amplification elements comprise discrete semiconductor components operable in the microwave frequency range.

14. The bi-directional amplifier according to claim 1, wherein said at least one first and said at least one second semiconductor amplification elements are integrated into an integrated circuit device.

15. The bi-direction amplifier according to claim 1, wherein said first and second biased semiconductor amplification elements comprise elements from the group of bi-polar transistors, Heterojunction Bi-polar Transistors (HBTs), Metal Oxide Semiconductor Field Effect Transistors (MOSFETs), High Electron Mobility Transistors (HEMTs) and other types of biased semiconductor amplification elements suitable for use as amplification elements.

16. A method for bi-directional amplification of signals received or signals to be transmitted in a communication circuit comprising the steps of:
obtaining a bi-directional amplifier comprising at least one first biased semiconductor amplification element coupled to a first impedance matching network, at least one second biased semiconductor amplification element coupled to a second impedance matching network, the bi-directional amplifier having a first device for biasing said first biased semiconductor amplification element and a second device for biasing said second biased semiconductor amplification element, wherein
said first impedance matching network is a first common impedance matching network for said at least one first biased semiconductor amplification element and for said at least one second biased semiconductor amplification element, and
said second impedance matching network is a second common impedance matching network for said at least one first biased semiconductor element, wherein
the first common impedance network is an output impedance matching network for said at least one first biased semiconductor element and an input impedance matching network for said at least one second biased semiconductor element, and
the second common impedance matching network is an output impedance matching network for said at least one second biased semiconductor element and an input impedance matching network for said at least one first biased semiconductor element,
the bi-directional amplifier further comprises means for achieving equal impedances for said at least one first and said at least one second biased semiconductor elements, wherein said means is connected between said at least one first and said at least one second biased semiconductor elements; and
amplifying a signal received at said first or said second biased semiconductor amplification element or a signal to be transmitted from said first or said second biased semiconductor amplification element by biasing said second biased semiconductor amplification element for zero current, while biasing said first biased semiconductor amplification element for non-zero current or by biasing said first biased semiconductor amplification element for zero current, while biasing said second based semiconductor for non-zero current.

17. The method according to claim 16, wherein said step of obtaining a bi-directional amplifier further comprises the step of coupling said at least one first and said at least one second biased semiconductor amplification element into an anti-parallel configuration to each other.

18. The method according to claim 16, wherein said step of obtaining a bidirectional amplifier further comprises providing parallel feedback for said first and said second biased semiconductor amplification elements.

19. The method according to one of claim 16, wherein said step of obtaining a bi-directional amplifier further comprises amplifying a received signal in one direction and a transmitted signal in the opposite direction or vice versa on the same transmission line.

20. A bi-directional transceiver for signals in a communication circuit comprising:
at least one first biased semiconductor amplification element with a corresponding first impedance matching network and at least one second biased semiconductor amplification element with a second impedance matching network; and
a first device for biasing said first biased semiconductor amplification element and a second device for biasing said second biased semiconductor amplification element and in that said first and said second device for biasing are adapted to alternatively bias said first and said second biased semiconductor amplification elements;
said first impedance matching network is a first common impedance matching network for said at least one first biased semiconductor amplification element and for said at least one second biased semiconductor amplification element;
said second impedance matching network is a second common impedance matching network for said at least one first biased semiconductor element, wherein
the first common impedance network is an output impedance matching network for said at least one first biased semiconductor element and an input impedance matching network for said at least one second biased semiconductor element, and
the second common impedance matching network is an output impedance matching network for said at least one second biased semiconductor element and an input impedance matching network for said at least one first biased semiconductor element,
means for achieving equal impedances for said at least one first and said at least one second biased semiconductor elements, wherein said means is connected between said at least one first and said at least one second biased semiconductor elements.

21. An integrated circuit comprising a bi-directional amplifier for amplification of signals received or signals to be transmitted in a communication circuit, comprising:
- at least one first biased semiconductor amplification element coupled to a first impedance matching network,
- at least one second biased semiconductor amplification element coupled to a second impedance matching network,
- a first device for biasing said first biased semiconductor amplification element and a second device for biasing said second biased semiconductor amplification element wherein the direction of signal amplification is controlled by said first or said second device for biasing said first or second biased semiconductor amplification element,
- said first impedance matching network is a first common impedance matching network for said at least one first biased semiconductor amplification element and for said at least one second biased semiconductor amplification element,
- said second impedance matching network is a second common impedance matching network for said at least one first biased semiconductor element, wherein
  - the first common impedance network is an output impedance matching network for said at least one first biased semiconductor element and an input impedance matching network for said at least one second biased semiconductor element, and
  - the second common impedance matching network is an output impedance matching network for said at least one second biased semiconductor element and an input impedance matching network for said at least one first biased semiconductor element,
- the bi-directional amplifier further comprises means for achieving equal impedances for said at least one first and said at least one second biased semiconductor elements, wherein said means is connected between said at least one first and said at least one second biased semiconductor elements.

22. A mobile terminal, comprising:
- a bi-directional amplifier for amplification of signals received or signals to be transmitted in a communication circuit, said bi-directional amplifier further comprising:
- at least one first biased semiconductor amplification element coupled to a first impedance matching network;
- at least one second biased semiconductor amplification element coupled to a second impedance matching network;
- a first device for biasing said first biased semiconductor amplification element and a second device for biasing said second biased semiconductor amplification element wherein the direction of signal amplification is controlled by said first or said second device for biasing said first or second biased semiconductor amplification element; and
- said first impedance matching network is a first common impedance matching network for said at least one first biased semiconductor amplification element and for said at least one second biased semiconductor amplification element;
- said second impedance matching network is a second common impedance matching network for said at least one first biased semiconductor element, wherein
  - the first common impedance network is an output impedance matching network for said at least one first biased semiconductor element and an input impedance matching network for said at least one second biased semiconductor element, and
  - the second common impedance matching network is an output impedance matching network for said at least one second biased semiconductor element and an input impedance matching network for said at least one first biased semiconductor element,
- the bi-directional amplifier further comprises means for achieving equal impedances for said at least one first and said at least one second biased semiconductor elements, wherein said means is connected between said at least one first and said at least one second biased semiconductor elements.

23. A telecommunications infrastructure component, comprising:
- a bi-directional amplifier for amplification of signals received or signals to be transmitted in a communication circuit, said bi-directional amplifier further comprising:
- at least one first biased semiconductor amplification element coupled to a first impedance matching network;
- at least one second biased semiconductor amplification element coupled to a second impedance matching network;
- a first device for biasing said first biased semiconductor amplification element and a second device for biasing said second biased semiconductor amplification element wherein the direction of signal amplification is controlled by said first or said second device for biasing said first or second biased semiconductor amplification element;
- said first impedance matching network is a first common impedance matching network for said at least one first biased semiconductor amplification element and for said at least one second biased semiconductor amplification element;
- said second impedance matching network is a second common impedance matching network for said at least one first biased semiconductor element, wherein
  - the first common impedance network is an output impedance matching network for said at least one first biased semiconductor element and an input impedance matching network for said at least one second biased semiconductor element, and
  - the second common impedance matching network is an output impedance matching network for said at least one second biased semiconductor element and an input impedance matching network for said at least one first biased semiconductor element,
- the bi-directional amplifier further comprises means for achieving equal impedances for said at least one first and said at least one second biased semiconductor elements, wherein said means is connected between said at least one first and said at least one second biased semiconductor elements.

* * * * *

UNITED STATES PATENT AND TRADEMARK OFFICE
CERTIFICATE OF CORRECTION

| | | |
|---|---|---|
| PATENT NO. | : 8,190,099 B2 | Page 1 of 1 |
| APPLICATION NO. | : 12/438844 | |
| DATED | : May 29, 2012 | |
| INVENTOR(S) | : Berg et al. | |

It is certified that error appears in the above-identified patent and that said Letters Patent is hereby corrected as shown below:

On the Title Page, item (57), under "ABSTRACT", in Column 2, Line 8, delete "coupled" and insert -- connected --, therefor.

On the Title Page, item (57), under "ABSTRACT", in Column 2, Line 10, delete "coupled" and insert -- connected --, therefor.

In Column 3, Line 62, delete "form" and insert -- from --, therefor.

In Column 4, Line 56, delete "based" and insert -- biased --, therefor.

In Column 6, Line 63, delete "show" and insert -- shows --, therefor.

In Column 7, Line 18, delete "route" and insert -- route. --, therefor.

In Column 7, Line 44, delete "Transistors," and insert -- Transistors), --, therefor.

In Column 9, Line 27, delete "amplification" and insert -- amplification) --, therefor.

In Column 14, Line 19, in Claim 16, delete "based" and insert -- biased --, therefor.

Signed and Sealed this
Twenty-second Day of January, 2013

David J. Kappos
*Director of the United States Patent and Trademark Office*